(12) United States Patent
Nakabayashi et al.

(10) Patent No.: US 9,232,655 B2
(45) Date of Patent: Jan. 5, 2016

(54) WIRING SUBSTRATE AND LIGHT EMITTING DEVICE

(71) Applicant: NICHIA CORPORATION, Anan-shi (JP)

(72) Inventors: Takuya Nakabayashi, Tokushima (JP); Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/582,282

(22) Filed: Dec. 24, 2014

(65) Prior Publication Data

US 2015/0181711 A1   Jun. 25, 2015

(30) Foreign Application Priority Data

Dec. 24, 2013 (JP) ................... 2013-264949

(51) Int. Cl.
| | | |
|---|---|---|
| H01L 33/00 | (2010.01) |
| H05K 1/18 | (2006.01) |
| H01L 33/48 | (2010.01) |
| H05K 1/03 | (2006.01) |
| H05K 1/09 | (2006.01) |
| H05K 1/02 | (2006.01) |

(52) U.S. Cl.
CPC .............. *H05K 1/181* (2013.01); *H01L 33/486* (2013.01); *H05K 1/0274* (2013.01); *H05K 1/0306* (2013.01); *H05K 1/09* (2013.01); *H05K 2201/0326* (2013.01); *H05K 2201/10106* (2013.01)

(58) Field of Classification Search
CPC .. H01L 33/486; H05K 1/0274; H05K 1/0306; H05K 1/181
See application file for complete search history.

(56) References Cited

U.S. PATENT DOCUMENTS

| | | | |
|---|---|---|---|
| 6,413,620 B1 | 7/2002 | Kimura et al. | |
| 6,544,654 B1 | 4/2003 | Fukaya et al. | |
| 2009/0085180 A1* | 4/2009 | Kan et al. | 257/675 |
| 2010/0259930 A1* | 10/2010 | Yan | 362/235 |
| 2011/0024104 A1 | 2/2011 | Griffiths | |
| 2012/0085481 A1* | 4/2012 | Abe et al. | 156/89.12 |
| 2012/0265474 A1* | 10/2012 | Rearick et al. | 702/104 |
| 2015/0223335 A1* | 8/2015 | Liao et al. | 361/760 |

FOREIGN PATENT DOCUMENTS

| | | |
|---|---|---|
| JP | 2515202 B2 | 10/1993 |
| JP | 07-273447 | 10/1995 |
| JP | 2001-015895 | 1/2001 |
| JP | 2001-322831 | 11/2001 |
| JP | 2011-176302 | 9/2011 |
| JP | 2011-228672 | 11/2011 |

* cited by examiner

*Primary Examiner* — Nathan Ha
(74) *Attorney, Agent, or Firm* — Mori & Ward, LLP

(57) ABSTRACT

Discoloration is suppressed in a wiring substrate including a conductive member including silver. A wiring substrate includes a ceramic layer and a conductive member including a conductive layer disposed on an upper surface of the ceramic layer. The conductive member includes silver and at least a portion of an upper surface of the conductive layer is covered with a covering layer. The covering layer includes an inorganic reflecting layer and a glass layer stacked on the inorganic reflecting layer.

8 Claims, 6 Drawing Sheets

WIRING SUBSTRATE AND LIGHT EMITTING DEVICE

BACKGROUND OF THE INVENTION

1. Field of the Invention

The present disclosure relates to a wiring substrate using ceramic and a light emitting device including the wiring substrate.

2. Description of the Related Art

Low temperature co-fired ceramics substrates (hereinafter, referred to as "LTCC substrates") have been known as a wiring substrate for a light emitting device including a semiconductor light emitting element (hereinafter, also referred to as a "light emitting element"). Since an LTCC substrate is more inexpensive than a high temperature fired ceramics substrate made of aluminum nitride or the like, a reduction in cost can be expected.

It has been known that silver is used for a conductive layer of an LTCC substrate. Moreover, it has been known that a glass layer is provided on a surface of the conductive layer provided on an upper surface of the LTCC substrate, in order to prevent corrosion of silver.

For example, see JP 2011-228672 A.

However, a glass layer provided as described above is occasionally unsatisfactory for suppressing discoloration of a wiring substrate due to silver.

SUMMARY OF THE INVENTION

The present disclosure provides a wiring substrate including a ceramic layer and a conductive member disposed on an upper surface of the ceramic layer. In the wiring substrate, the conductive member includes silver and at least a portion of an upper surface thereof is covered with a covering layer. The covering layer includes an inorganic reflecting layer and a glass layer stacked on the inorganic reflecting layer.

According to the embodiments of the present invention, it is possible to obtain a wiring substrate in which discoloration due to silver is reduced, and with the use of the wiring substrate, a light emitting device which is excellent in light extraction efficiency can be obtained.

DETAILED DESCRIPTION OF EMBODIMENTS

Embodiments of the present invention will be described below with reference to the drawings. The embodiments illustrated below merely exemplify a wiring substrate and a light emitting device for embodying the technical ideas of the present invention. Therefore, the present invention does not intend to limit the wiring substrate and the light emitting device to those described in the embodiments.

The specification is not intended to limit the members in the appended claims to only those members shown in the embodiments. In particular, the dimensions, materials, shapes, and relative arrangements of the constituents described in the embodiments do not intend to limit the scope of the present invention unless otherwise specified, but are merely illustrative. In the respective drawings, the sizes and positional relations of the members may be exaggerated to make the description clear as necessary. In the following description, further, identical designations and reference marks represent identical or equivalent members. Therefore, the detailed description of such members is omitted as appropriate.

<Wiring Substrate>

Figure 1A:
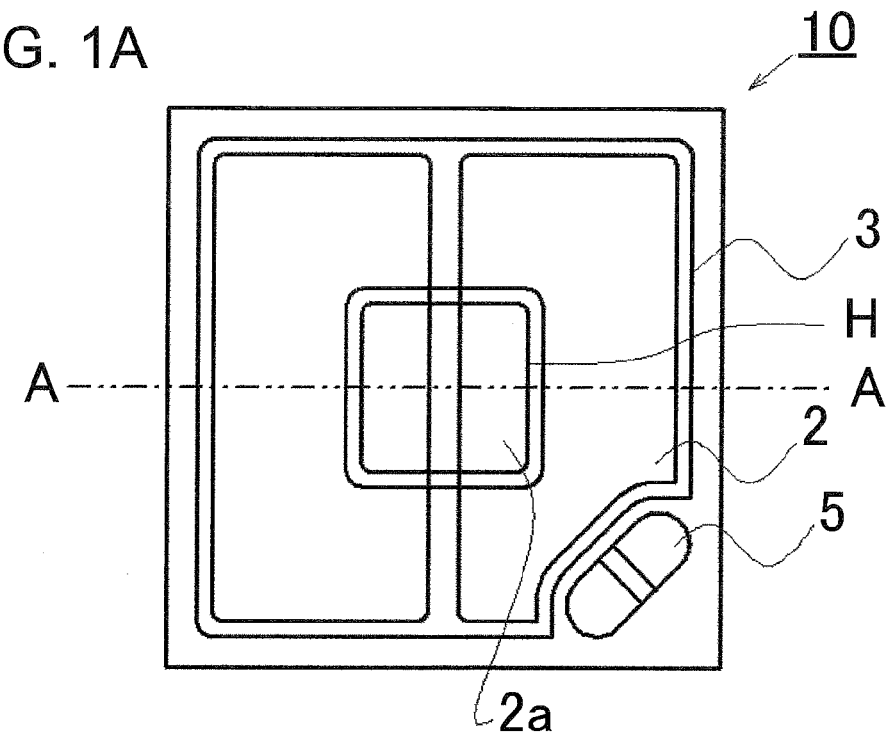
FIG. 1A is a schematic top view illustrating a wiring substrate according to an embodiment.
Figure 1B:
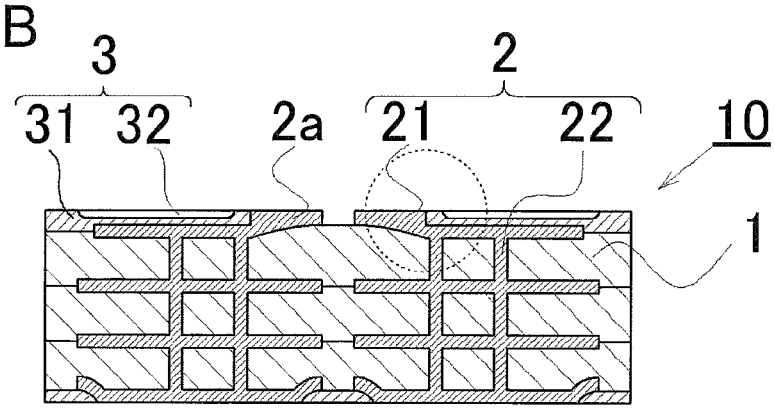
FIG. 1B is a schematic sectional view taken along line A-A in FIG. 1A.
Figure 1C:
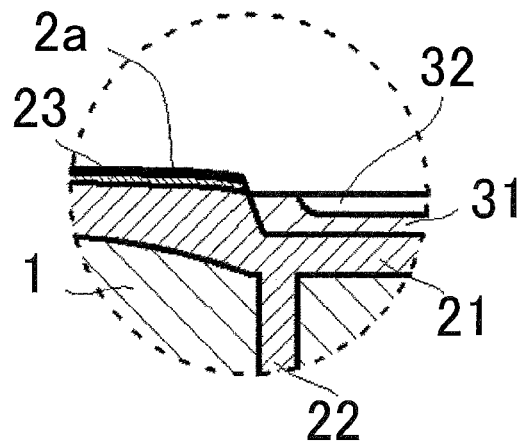
FIG. 1C is a partial enlarged view of a portion surrounded by a broken line in FIG. 1B.
Figure 2A:
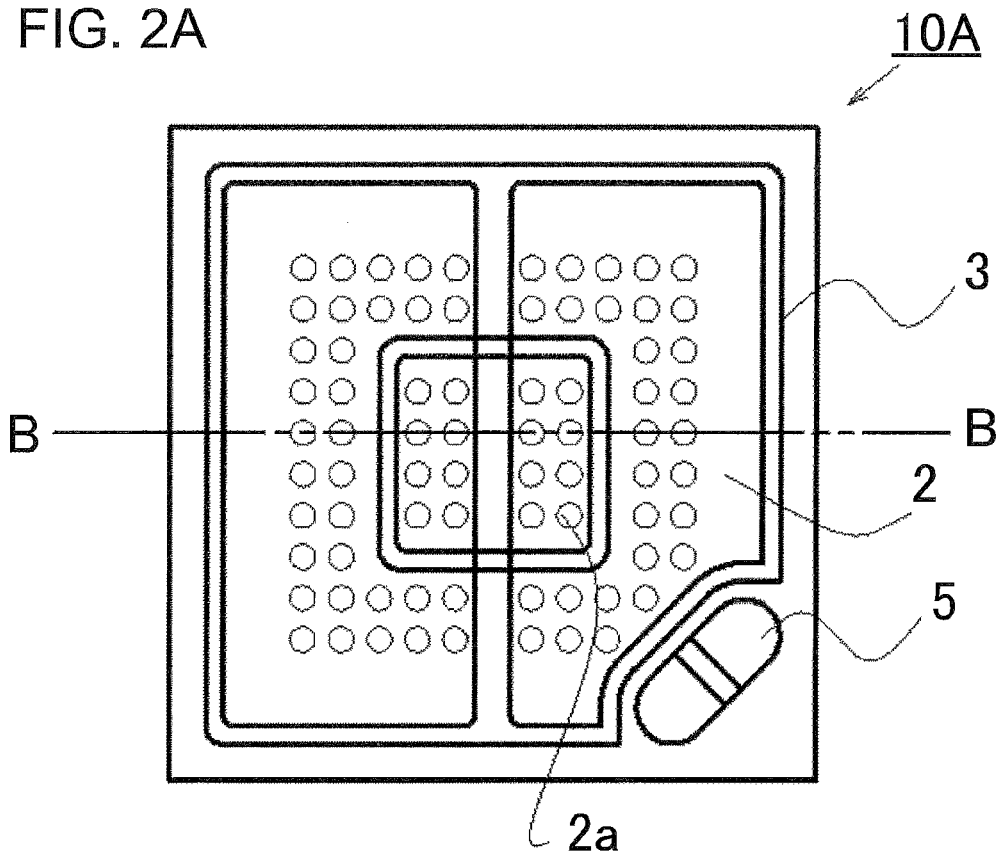
FIG. 2A is a schematic top view illustrating a wiring substrate according to another embodiment.
Figure 2B:
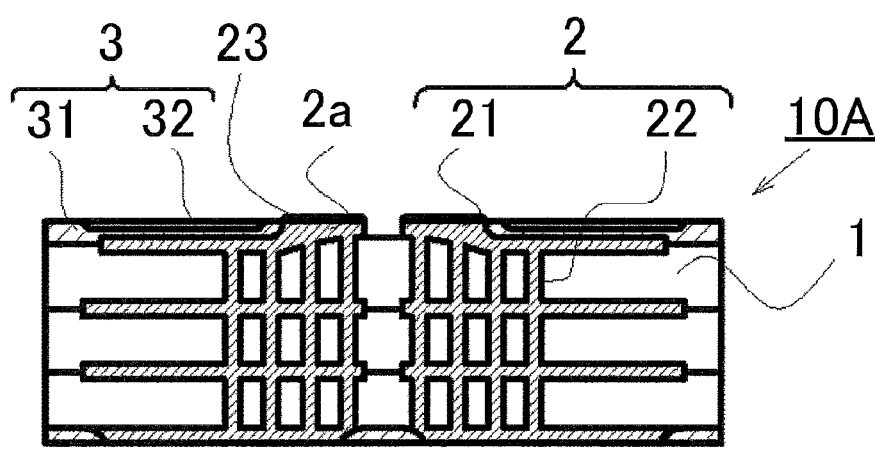
FIG. 2B is a schematic sectional view taken along line B-B in FIG. 2A.
Figure 3A:
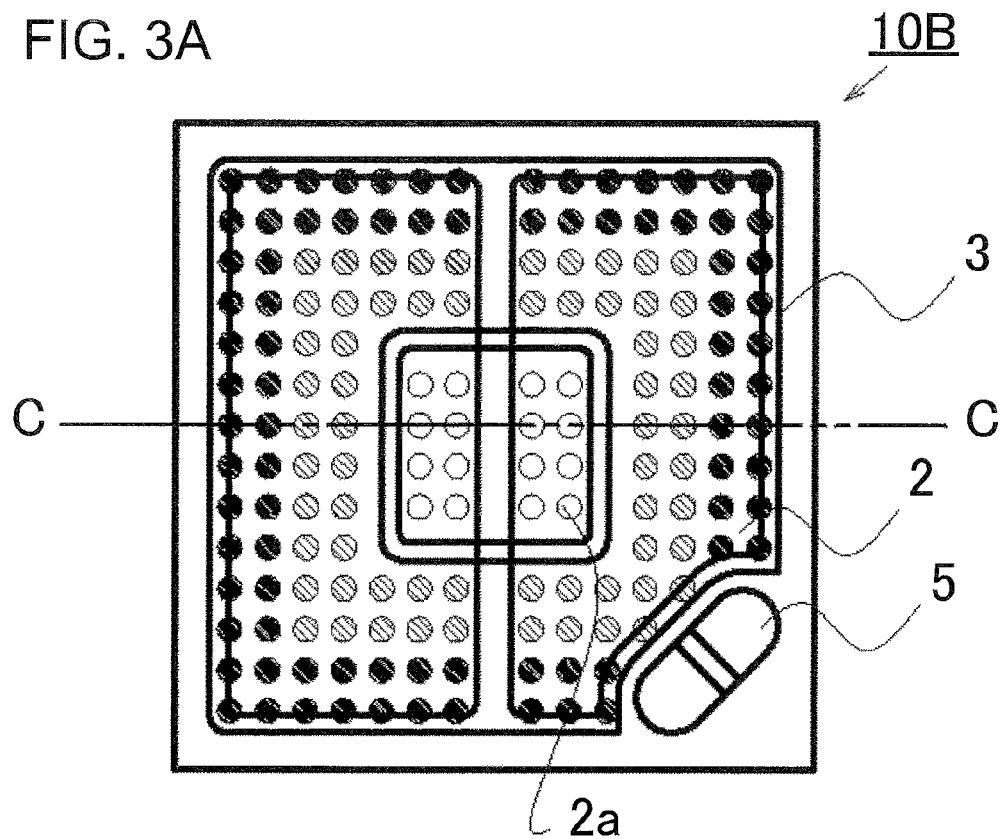
FIG. 3A is a schematic top view illustrating a wiring substrate according to still another embodiment.
Figure 3B:
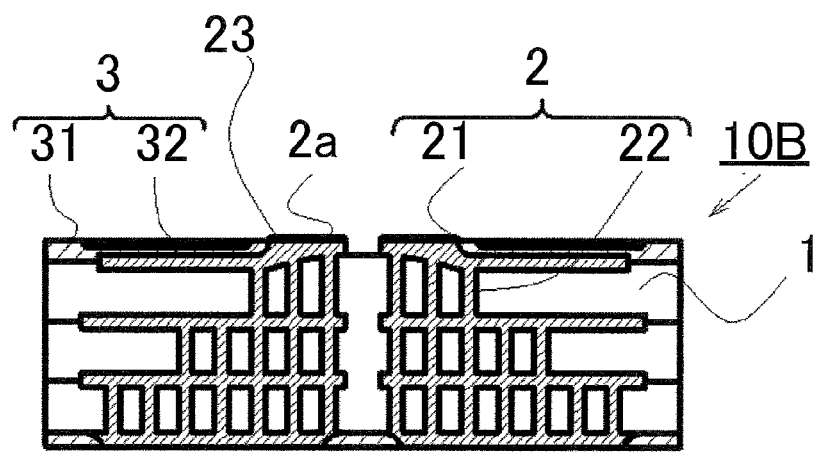
FIG. 3B is a schematic sectional view taken along line C-C in FIG. 3A.
Figure 5:
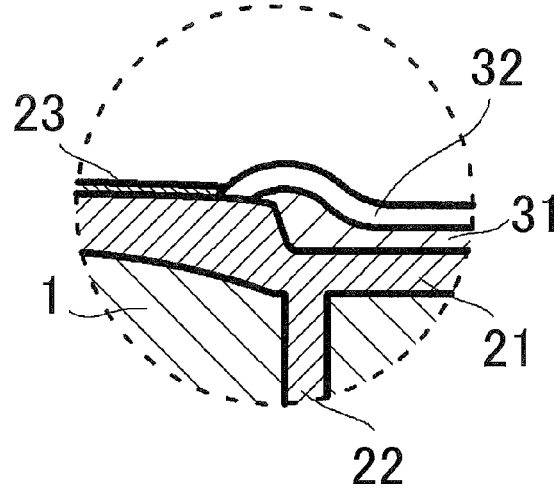
FIG. 5 is a sectional view illustrating a modification of the portion illustrated in FIG. 1B.
Figure 7:
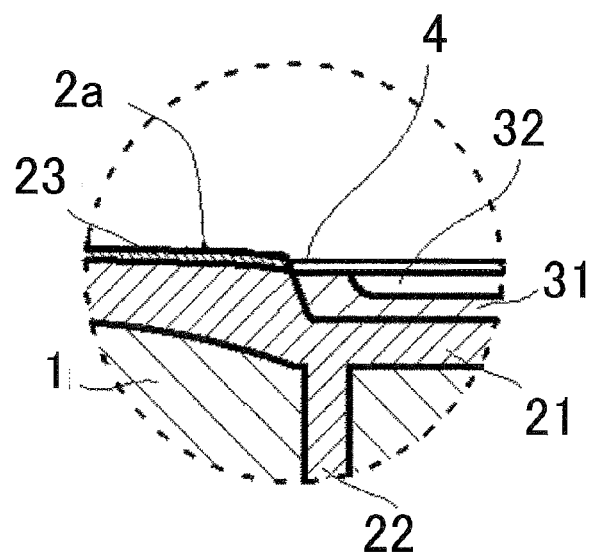
FIG. 7 is a sectional view illustrating a modification of the portion illustrated in FIG. 1B.

FIGS. 1A, 1B and 1C illustrate a wiring substrate according to an embodiment. FIG. 1A is a schematic top view of the wiring substrate. FIG. 1B is a schematic sectional view taken along line A-A in FIG. 1A. FIG. 1C is an enlarged view of a portion surrounded by a broken line in FIG. 1B. FIGS. 5 and 7 each illustrate a modification of the portion illustrated in FIG. 1C. FIGS. 2A and 2B, FIGS. 3A and 3B respectively illustrate modifications of the wiring substrate illustrated in FIGS. 1A and 1B, in which the arrangement, number, etc., of vias are changed. FIG. 2A is a schematic top view of the wiring substrate, and FIG. 2B is a schematic sectional view taken along line B-B in FIG. 2A. FIG. 3A is a schematic top view of the wiring substrate, and FIG. 3B is a schematic sectional view taken along line C-C in FIG. 3A. Although vias are not shown in the top view of FIG. 1A, depending on the method of forming vias, the vias may be visually recognized or may hardly visible in a top view, thus, in the present embodiments, the vias may be visually recognized or may hardly visual. Also, although a wiring substrate is typically handled as an aggregate of wiring substrates for a plurality of light emitting devices, in the description below, a wiring substrate for a single light emitting device will be illustrated for the sake of convenience.

In an illustrative embodiment of the present invention, a wiring substrate (LTCC substrate) 10 includes insulative ceramic layers 1 and conductive members 2. Each of the conductive members 2 includes conductive layers stacked with the ceramic layers 1, and vias for electrically connecting the respective conductive layers. The surfaces of the conductive layers disposed on an upper surface (front surface) of the uppermost ceramic layer 1 are respectively covered with covering layers 3. The conductive member 2 (the conductive layers and the vias) contains silver. Each of the covering layers 3 disposed on the respective uppermost conductive layers has a stacked structure in which an inorganic reflecting layer 31 and a glass layer 32 are stacked.

<Wiring Substrate>

The wiring substrate (LTCC substrate) 10 has such a size that a light emitting element is mountable thereon, and serves as a base member of a light emitting device.

The wiring substrate 10 includes the insulative ceramic layers 1 which serve as a base, and the conductive member 2 for supplying current (applying voltage) to a light emitting element. The wiring substrate 10 may be formed into a quadrangular shape, a rectangular shape, a polygonal shape, a circular shape, or a combined shape of these shapes, when being seen from above. Moreover, the wiring substrate 10 may be formed into such a shape but partially missing due to a cathode mark (and/or an anode mark).

As illustrated in FIGS. 1A and 1B, the wiring substrate 10 may be formed into a flat plate shape as a whole. Alternatively, the wiring substrate 10 may be shaped to have a recess. In the case of mounting a light emitting element in the recess, the recess preferably has an opening formed at a substantially center of the wiring substrate. Moreover, the opening is preferably formed to have such a size that the light emitting element is mountable on a floor of the recess.

In the case of mounting a protective element such as a Zener diode, the protective element may be mounted on the same plane as a plane where a light emitting element is mounted, but a wiring substrate may define a recess which allows mounting of the light emitting element at a location hardly irradiated with light from the light emitting element. In the wiring substrate, for example, the recess for accommodating the protective element may be formed at a position offset from the center of the wiring substrate or on a lower surface (back surface) of the wiring substrate.

FIG. 1A illustrates the wiring substrate 10 which has a quadrangular flat plate-shape in a top view, and one of the corner regions defines a recess 5 with a track-shape opening for accommodating a protective element. In the embodiment, the wiring substrate 10 has one recess 5, but may have at least two recesses as necessary. Moreover, the opening of the recess 5 may be formed into a quadrangular shape, a circular shape, or a polygonal shape in addition to the track shape.

The thickness of a wiring substrate may be selected according to the purpose and usage. In the case of a flat plate-shaped wiring substrate, the thickness is preferably about 0.1 mm to 2 mm, more preferably about 0.1 mm to 0.6 mm. The recess 5 for a protective element preferably has a depth of about 0.1 mm to 0.4 mm, and preferably has an opening area of about 5% to 20% relative to an upper surface area of the wiring substrate.

Although not illustrated in the drawings, a wiring substrate which may be used herein has a recess for mounting a light emitting element. In the case where the recess for mounting a light emitting element is formed, the distance (total thickness) from an upper surface to a lower surface of the wiring substrate is preferably about 0.4 mm to 2 mm, more preferably about 0.4 mm to 0.8 mm. The recess has a depth of preferably about 0.05 mm to 1 mm, more preferably about 0.1 mm to 0.6 mm.

The wiring substrate preferably has a size of 1.2 mm to 5 mm when being seen from above, and this size corresponds to a size of one light emitting device. In the case of forming the recess for a light emitting element, an opening of the recess preferably has a maximum diameter (width) of 0.8 mm to 4.5 mm. The opening of the recess may be formed into a quadrangular shape, a rectangular shape, a polygonal shape, a circular shape, or a combined shape of these shapes, when being seen from above. In the recess, an inner wall may be perpendicular to the floor or may be inclined to the floor. Alternatively, the inner wall of the recess may have a step difference.

The conductive member 2 (the conductive layer) has an exposed portion (element mounting region) 2a. As illustrated in FIG. 10, the exposed portion 2a is elevated compared to its adjacent regions, and is modified in shape so that the height thereof is equal to or higher than the height of an upper surface of the covering layer 3. In the case of using a plurality of ceramic layers which are equal in thickness before applying a pressure, the applying of a pressure may produce different thicknesses throughout the entire ceramic layers or in part, either of which can be employed.

(Ceramic Layer)

The ceramic layer 1 serves as a base of the wiring substrate 10, and is an insulative plate-shaped member. The ceramic layer 1 may be of a single-layer structure or a multilayer structure as illustrated in FIG. 1(b), in accordance with the purpose and usage. The ceramic layer 1 is preferably of a two-layer or three-layer structure. The ceramic layer may be made of an inorganic oxide. More specifically, the ceramic layer may be mainly composed of glass powders (powders composed of $SiO_2$, $B_2O_3$, $Al_2O_3$, CaO, $Na_2O$, BaO, $K_2O$, and the like) and ceramic powders (powders composed of $Nb_2O_3$, $ZrO_2$, ZnO, MgO, $Y_2O_3$, $TiO_2$, and the like). In the case of stacking a plurality of ceramic layers, the respective ceramic layers may have substantially equal thickness or may have different thickness, and the ceramic layers of substantially equal thickness are preferably stacked. Moreover, the thickness of each ceramic layer is preferably 0.05 mm to 0.25 mm.

In each ceramic layer, the entire thickness is not necessarily even. A wiring substrate may be obtained in such a manner that stacking ceramic layers (green sheets), a conductive member, and a covering layer, applying a pressure to be firmly adhered, and then firing, in which, the applying a pressure prior to firing may result in deformation. For example, as illustrated in FIGS. 1B and 1C, the ceramic layer may be deformed such that the region which is not covered with the covering layer (the region around the center of the wiring substrate) partly raised upward at the upper surface side of the wiring substrate. FIGS. 1B and 1C illustrate an example in which the ceramic layer 1 is deformed such that the exposed portion (element mounting region) 2a of the conductive member 2 is raised upward and the height thereof becomes equal to or higher than the height of the upper surface of the covering layer 3. In the case of using the plurality of ceramic layers which have substantially equal thickness before applying a pressure, the thicknesses may be either entirely or partially different after firing. The upper surface of the region where the exposed portion is partly raised and deformed is not flat, but is curved as illustrated in FIG. 1C. Even when such a curved surface is used as an element mounting region, disadvantageous inclination or the like of a light emitting element may not substantially occur. Rather, as compared with the case where the exposed portion is not raised, self alignment effect can be easily exerted at the time of solder mounting the light emitting element, which can facilitate an improvement in the mounting position precision of the light emitting element. Moreover, a light emitting portion (i.e. light emitting layer) of the light emitting element can be located slightly upward, for example, about 5 to 50 µm which allows for an increase of the amount of light incident on the inorganic reflecting layer; in other words, absorption of light by a solder fillet can be reduced. Thus, degradation in light extraction efficiency can be reduced.

(Conductive Member)

The conductive member 2 is a member for supplying current to a light emitting element and the like. As illustrated in FIGS. 1B and 1C, the conductive member 2 includes the conductive layers 21 stacked with the ceramic layers 1, and the vias 22 for electrically connecting the respective conductive layers. In the present specification, among the conductive layers, the conductive layer provided on the upper surface of the wiring substrate is referred to as an upper conductive layer, and the conductive layer provided on the lower surface of the wiring substrate is referred to as a lower conductive layer. The upper conductive layer is electrically connected to the light emitting element, and the lower conductive layer is electrically connected to a secondary substrate such as a circuit board. The upper conductive layer and the lower conductive layer are electrically connected to each other by the vias, an internal conductive layer, and, in some cases, a side surface conductive member provided on a side surface, those conductive members collectively serve as an electrode to supply current to the light emitting element. Moreover, the conductive member also functions as a heat dissipation path for dissipating heat generated from the light emitting element to the outside. Some of the conductive members may be provided for the purpose of heat dissipation, without contributing to the supply of the electric power.

In the embodiment, the upper conductive layer among the conductive layers is covered, but not completely covered, with the covering layer. More specifically, the upper conductive layer has the exposed portion which is not covered with the covering layer so as to be electrically connected to a light emitting element. For example, as illustrated in FIGS. 1A and 1B, an opening is defined in the covering layer 3 provided on the upper surface of the upper conductive layer, and an exposed portion 2a where the upper conductive layer is exposed is arranged in the opening. In the case where the light emitting element is mounted in a face-down manner (flip chip mounting), the exposed portion 2a serves as an element mounting region. In this case, the shape, size and the like of the exposed portion 2a are set in accordance with an arrangement of electrodes for the light emitting element. In the case where the light emitting element is mounted in a face-up manner, moreover, the light emitting element can be mounted on the conductive member 2 or the covering layer 3. In detail, the light emitting element may be mounted on the conductive member (exposed portion) 2a exposed in the opening of the covering layer 3. Alternatively, the light emitting element may be mounted on the covering layer 3 in a state that the covering layer 3 has no opening. In the case where the light emitting element is mounted in a face-up manner, the exposed portion is needed to be provided inside the opening of the covering layer, as a wire connection region. In any cases, the exposed portion is provided at a desired position in accordance with the number of light emitting elements, the size and shape of the light emitting element, and an arrangement of the light emitting elements.

The exposed portion can be covered with a metal layer made of a metal different from a metal of the conductive member. For example, as illustrated in FIG. 1C, a metal layer 23 made of a metal which has high resistance to corrosion such as gold (Au) is preferably provided on the outermost surface of the exposed portion 2a. The metal layer 23 is disposed after forming the covering layer 3, by plating for example. The thickness of the metal layer 23 may be substantially equal in height to the upper surface of the covering layer 3 or may be higher in height than the upper surface of the covering layer 3. For example, the thickness of the metal layer 23 may be about 0.1 μm to 5 μm. The metal layer 23 is preferably formed on the entire conductive member 2 (the conductive layer 21) which is not covered with the covering layer 3. In other words, the metal layer 23 is preferably provided to come into close contact with the covering layer 3 without a gap between the metal layer 23 and the covering layer 3 (a region where the conductive member 2 is exposed). Alternatively, the metal layer 23 may be partly stacked, for example, the metal layer 23 may be partly formed on the covering layer 3 as illustrated in FIG. 5.

The conductive member is preferably provided to have a wide area or a large volume at the upper surface, lower surface, or inside of the wiring substrate. Specifically, the conductive layer is preferably provided to have a wide area. On the other hand, the via is preferably provided to have a large diameter or the number of vias is preferably increased. Since the ceramic layer used in the embodiment is lower in heat dissipation property than high temperature co-fired ceramics, the wiring substrate having a large number of heat dissipating paths is advantageous. In particular, the vias allow efficient heat dissipation when being provided immediately below the light emitting element mounting region.

The size (area) of the conductive layer is preferably provided to occupy 10% to 99% of the size of the wiring substrate (the ceramic layer). The size of the conductive layer is more preferably provided to occupy 50% to 99% of the size of the wiring substrate. As described above, the area of the conductive layer is increased in view of the heat dissipation property. Therefore, even in a case where a conductive layer having low reflectivity or glossiness is formed in a wide range, the wiring substrate is allowed to have excellent heat dissipation property, light extraction efficiency, and resistance to corrosion by covering the conductive member with the covering layer including the inorganic reflecting layer and the glass layer, as described in the embodiment.

As illustrated in, for example, FIG. 1A, the two upper conductive layers are provided to occupy about 65% of the area of the wiring substrate at the upper surface of the wiring substrate. From another viewpoint, the upper conductive layer is provided to have an area which is about three times as large as the element mounting region for bringing the light emitting element into conduction (i.e., the exposed portion in the opening of the covering layer). An upper conductive layer having an area required for mounting an element is preferably provided only for the purpose of bringing the light emitting element into conduction. In the embodiment, the upper conductive layer provided to have a wide area allows facilitation of lateral heat spread. The intermediate conductive layer provided inside the wiring substrate is preferably provided to have a wide area so as to be connected to a large number of vias.

The via is preferably provided to have a large volume in such a manner as to increase the number of vias or enlarge the diameter of the via. For example, the via is provided to occupy preferably about 2 to 30%, more preferably about 5 to 20% relative to the volume of the wiring substrate. Alternatively, the via is provided to occupy preferably about 2 to 30%, more preferably about 5 to 20% relative to the area of the wiring substrate.

For example, in a case where a wiring substrate for one light emitting device has dimensions of about 3 mm in length, 3 mm in width, and 0.4 mm in height, 20 to 40 vias each having a diameter of 0.15 mm are preferably provided. Moreover, a large number of vias is preferably disposed at a position near a light emitting element.

The vias are described with reference to FIGS. 2A, 2B, 3A, and 3B. The number of vias 22 in the wiring substrate 10A illustrated in FIGS. 2A and 2B is larger than the number of vias 22 in the wiring substrate 10 illustrated in FIGS. 1A and 1B. As illustrated in FIGS. 2A and 2B, the vias 22 are formed immediately below the exposed portion 2a of the conductive member 2 at the center of the wiring substrate. In the case where a light emitting element is mounted in a flip chip manner with the exposed portion 2a used as an element mounting region, the vias formed at the position described above allow efficient dissipation of heat generated from the light emitting element. Moreover, the vias 22 are also formed in the vicinity of the exposed portion. The vias 22 are formed more densely around the center of the wiring substrate. As described above, the vias are not formed at the same density when being seen from above the wiring substrate, but are formed at locally high density. For example, the vias are formed at high density in a region which requires more heat dissipation. Thus, the vias allow efficient heat dissipation.

FIGS. 3A and 3B illustrate the wiring substrate 10B in which the number of vias is further increased. In the wiring substrate 10B, the number of vias 22 at the lower side of the wiring substrate is larger than the number of vias 22 at the upper side. The vias 22 are formed immediately below the exposed portion 2a of the conductive member. In this region, the vias 22 are formed continuously from the upper layer to the lower layer. In each of the three ceramic layers, the vias 22 are formed immediately below the exposed portion.

Specifically, the uppermost ceramic layer 1 is provided with six (3×2) vias in the sectional view of FIG. 3B. The second ceramic layer from above (the middle layer in FIG. 3B) is provided with 10 (5×2) vias, that is, the six vias described above and additional two vias formed beside both ends of the six vias, respectively. In other words, no vias are formed immediately above the additional two vias. Further, the lowermost ceramic layer is provided with 14 (7×2) vias, that is, the 10 vias described above and additional two vias formed beside both ends of the 10 vias, respectively. No vias are formed immediately above the additional two vias. The number of vias is increased at the lower layer side, that is, the region where the vias are formed is increased (widened) as described above. Thus, heat from a light emitting element mounted on the exposed portion 2a can be spread in a lateral direction and a downward direction (in a flared form) and can be efficiently dissipated.

In FIGS. 2A, 2B, 3A, and 3B, the respective vias are regularly arranged in a matrix form in longitudinal and horizontal directions, and are formed in line symmetry, but not limited thereto. The respective vias may be formed in an arrangement other than the line symmetric arrangement, such as a random arrangement.

The conductive member (the conductive layers and the vias) provided on the ceramic layer may include palladium (Pd)-silver (Ag), silver, copper, or the like. In particular, the conductive member preferably includes silver having high heat dissipation property.

Moreover, inorganic oxide (ceramic powders and glass powders) which is a component of the ceramic layer may be added in the conductive member. An amount of the inorganic oxide to be added is preferably about 5 to 50 wt %. Alternatively, a component of the conductive member may be added in the ceramic layer. Thus, adhesion can be improved between the ceramic layer and the conductive member (the conductive layers and the vias). In particular, the conductive member having a wide area or a large volume allows firm adhesion to the ceramic layer. In the ceramic layer between the conductive members serving as a pair of positive and negative electrodes, a short circuit may occur when the conductive members remain electrically conductive, which is not preferable. Therefore, the conductive member is preferably made of a metal material which has conductivity before firing, but reduces the conductivity or is insulated after firing.

(Covering Layer)

The covering layer is provided to cover the upper surface of the conductive layer (the upper conductive layer) in the conductive member provided on the upper surface of the wiring substrate. The covering layer has the structure in which the inorganic reflecting layer and the glass layer are stacked. The stacked structure may include a stacked structure having a region where a boundary between an inorganic reflecting layer and a glass layer is unclear because of partial diffusion of a component of the glass layer or inorganic reflecting layer.

The conductive member which contains silver typically fired when forming the wiring substrate, which may result in low smoothness and not high glossiness in the surface of the upper conductive layer provided on the upper surface of the wiring substrate. Also, intrusion of contamination can occur during the firing, resulting in not high reflectance. At the time of firing, further, silver in the conductive member is diffused in the ceramic layer or the inorganic reflecting layer, and then appears from the surfaces of the respective layers, so that the portion where silver appears may be discolored. Moreover, the diffusion of Ag may occur in the case where formulation intended to improve the adhesion in order to increase the area or volume of the conductive layer or via.

Further, in the case where such a conductive member which contains silver is used, during the formation of the wiring substrate and/or during the fabrication of light emitting devices in which a light emitting element is mounted on the wiring substrate, upon applying electric current under the circumstance where the moisture exists such as atmospheric air, diffusion (i.e. migration) of silver into the ceramic layer may occur, which often lead to discoloration of the diffused silver into a dark color.

In the embodiment, the covering layer which covers the upper surface of the upper conductive layer in the conductive member including silver has the structure in which the inorganic reflecting layer and the glass layer are stacked in this order. Therefore, even when silver is diffused in the inorganic reflecting layer, the glass covering the inorganic reflecting layer allows suppression of the discoloration.

On the other hand, in order to supply current to the light emitting element, a region which is not covered with the covering layer, that is, an exposed portion is needed in the upper surface of the upper conductive layer. Therefore, the covering layer is provided with an opening. The opening of the covering layer may have a size and a shape which are required for conduction. In the case of mounting the light emitting element by face-down bonding (flip chip bonding), for example, the opening is provided in the covering layer in accordance with the size of the light emitting element formed into the substantially quadrangular shape when being seen from above, such that the upper conductive layer is exposed with a desired shape and at a desired position. In the case of mounting the light emitting element by face-up bonding and bringing the light emitting element into conduction using a wire, moreover, the exposed portion (the opening of the covering layer) sized and shaped to allow wire bonding is provided on the upper conductive layers at positive and negative electrode sides.

The inorganic reflecting layer and the glass layer may be equal in area and shape to each other. Alternatively, the inorganic reflecting layer and the glass layer may be different in area and shape from each other. For example, inorganic reflecting layers may be independently and separately formed on the respective conductive members, and a glass layer covering the respective inorganic reflecting layers may be formed over the upper conductive layers and the inorganic reflecting layers.

The covering layer in which the inorganic reflecting layer and the glass layer are stacked is preferably provided over a wide region of the upper surface of the upper conductive layer. The upper surface of the upper conductive layer and the upper surface of the ceramic layer may partly have a region covered with only the inorganic reflecting layer or a region covered with only the glass layer.

As illustrated in FIG. 1A, the inorganic reflecting layer is continuously provided over both the upper surfaces of the two upper conductive layers provided on the upper surface of the ceramic layer. Further, the inorganic reflecting layer is provided with the opening, where the upper conductive layer is exposed, at the position near the center of the wiring substrate. The opening is provided such that both the upper surfaces of the two upper conductive layers are exposed. Therefore, the ceramic layer between the two upper conductive layers is also exposed. As described above, one inorganic reflecting layer may integrally cover at least two upper conductive layers or inorganic reflecting layers may independently cover the respective upper conductive layers. In the case of cutting the wiring substrate into a light emitting device in the later process, the portion corresponding to the cutting position may be provided with no inorganic reflecting layer. In this case, an inorganic reflecting layer for integrally covering the plurality of conductive members may be provided for each light emitting device.

Figure 4A:
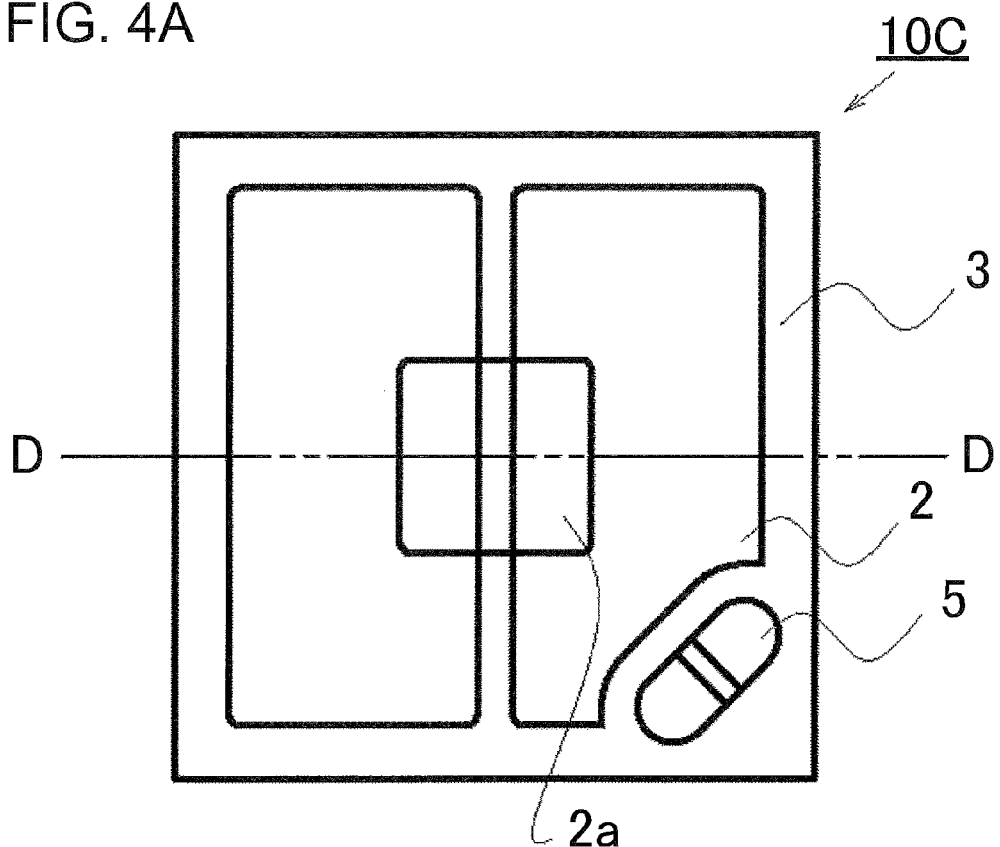
FIG. 4A is a schematic top view illustrating a wiring substrate according to yet another embodiment.
Figure 4B:
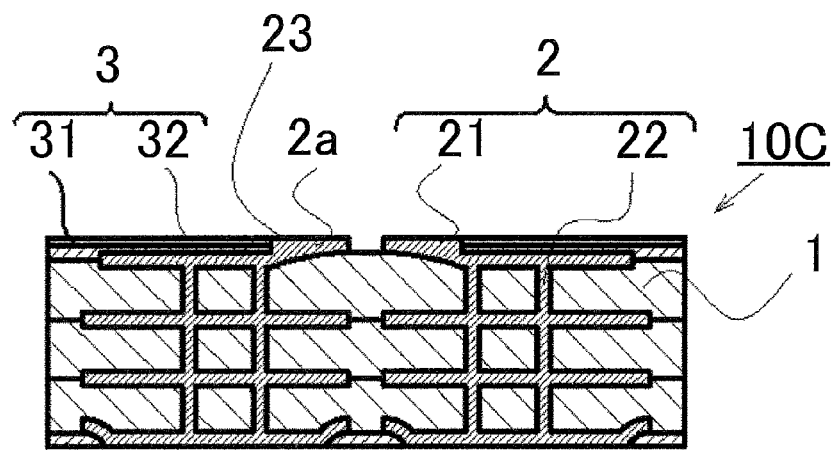
FIG. 4B is a schematic sectional view taken along line D-D in FIG. 4A.

The glass layer can be provided to cover the upper surface of the inorganic reflecting layer. The shape of the glass layer may be almost equal to or different from the shape of the inorganic reflecting layer. As illustrated in, for example, FIGS. 4A and 4B, the glass layer can be provided to cover almost the entire upper surface of the inorganic reflecting layer. As in the case of the inorganic reflecting layer, the glass layer is continuously formed over both the upper surfaces of the two upper conductive layers. Moreover, the glass layer is provided with an opening, where the two upper conductive layers and the ceramic layer between the upper conductive layers are exposed, at a position near the center of the wiring substrate.

As illustrated in FIGS. 1A and 1B, the glass layer may be provided such that the inorganic reflecting layer is partly exposed. In a case where an end of the covering layer is located on the upper conductive layer, the end of the covering layer is preferably only the inorganic reflecting layer. As illustrated in, for example, FIG. 1B, in a case where an edge of the opening of the covering layer is located on the upper conductive layer, the edge of the opening corresponds to the end of the covering layer. Therefore, the covering layer including inorganic reflecting layer which is not covered with the glass layer is formed on the corresponding portion. When the glass layer and the conductive member (the upper conductive layer) come into direct contact with each other, the glass layer may be discolored by diffusion of silver in the upper conductive layer. Therefore, the glass layer and the conductive member are provided to be spaced apart from each other. In other words, the upper conductive layer and the glass layer are preferably provided with the inorganic reflecting layer interposed therebetween when being seen from above and when being seen in cross section.

As illustrated in FIG. 5, the glass layer 32 may be in partial contact with the conductive layer 21. For example, in a case where a metal layer 23 is provided by gold (Au) plating on the exposed portion of the conductive layer 21, the metal layer is occasionally formed over the covering layer (the glass layer 32 and the inorganic reflecting layer 31) depending on the thickness of the metal layer 23. In this case, discoloration of the covering layer is not regarded as a significant problem.

(Inorganic Reflecting Layer)

The inorganic reflecting layer which constitutes a portion of the covering layer is a white layer mainly having a function of efficiently reflecting light from a light emitting element.

The inorganic reflecting layer is desirably provided before firing in the process of fabricating the wiring substrate. Specifically, the inorganic reflecting layer can be formed by applying (printing) slurry with a mask onto a predetermined position of an upper surface of a stacked body of a green sheet and a conductive member before firing or a predetermined position of a fired wiring substrate. The slurry to be used in the embodiment is a mixture of inorganic oxide (glass powders and ceramic powders) with various additives (such as a binder and a solvent), and is formed as the inorganic reflecting layer after firing or curing. Alternatively, the slurry is not directly applied onto the stacked body, but an inorganic reflecting layer formed into a thin sheet shape may be laminated onto the stacked body in a different process.

The inorganic reflecting layer may be made of a material which is the same as or different from the material of the ceramic layer in the wiring substrate. In the case where the two materials are different from each other, the material of the inorganic reflecting layer is preferably prepared such that the inorganic reflecting layer becomes higher in reflectivity than the fired ceramic layer. For example, the inorganic reflecting layer preferably contains the ceramic powders (white components) at a ratio higher than that of the ceramic layer. Moreover, the inorganic reflecting layer preferably has such a thickness that the conductive member (the upper conductive layer) provided therebelow cannot be seen through the inorganic reflecting layer. For example, the thickness of the inorganic reflecting layer is preferably 10 $\mu$m to 50 $\mu$m.

The inorganic reflecting layer which is provided on the stacked body of the green sheet and the conductive member (the conductive layer) before firing is subjected to firing together with the wiring substrate at the time of firing. Therefore, the inorganic reflecting layer is preferably formed of a member capable of enduring the firing temperature. Thus, the inorganic reflecting layer preferably contains a component similar to that of the ceramic layer. The inorganic reflecting layer is preferably made of slurry or paste obtained by mixing the ceramic powders and the glass powders with other additives. The slurry or paste is applied onto the stacked body, is dried, and then is fired. Thus, the inorganic reflecting layer can be fired at low temperature as in the case of the ceramic layer which is a base of the wiring substrate.

The inorganic reflecting layer which is provided on the fired wiring substrate may be made of slurry or paste obtained by mixing the ceramic powders and the glass powders with other additives as in the case described above. However, since the wiring substrate is already fired, the inorganic reflecting layer to be provided on the wiring substrate may be formed of a member which is cured at a temperature lower than the firing temperature of the wiring substrate, and then becomes whitened. Therefore, the inorganic reflecting layer may be an inorganic reflecting layer made of the slurry or paste whose composition is prepared such that the resultant inorganic reflecting layer can be fired at a temperature lower than the firing temperature of the wiring substrate. Alternatively, the inorganic reflecting layer may be an inorganic reflecting layer obtained by mixing a white filler such as titanium oxide into a resin.

(Glass Layer) The glass layer is provided on the inorganic reflecting layer, and constitutes a portion of the covering layer. The glass layer is provided on the inorganic reflecting layer so as to cover the inorganic reflecting layer. The glass layer mainly functions as a blocking layer for preventing moisture from entering the conductive member and the inorganic reflecting layer.

Both the inorganic reflecting layer and the glass layer can be provided before the wiring substrate is fired. That is, the covering layer can be subjected to firing once. In this case, since the glass layer is melted and bonded to the inorganic reflecting layer, the resultant covering layer is excellent in adhesive strength. Alternatively, the glass layer may be provided on the wiring substrate which is fired with the inorganic reflecting layer provided thereon. In the case of providing the covering layer in the different process as described above, a composition of glass is widely selectable. Therefore, a composition of glass can be selected in accordance with the purpose. Moreover, the wiring substrate is less susceptible to an influence of warpage due to differential shrinkage at the time of firing. In any process, the glass layer which covers the conductive member (the upper conductive layer) including silver and the inorganic reflecting layer provided on the conductive member can suppress discoloration of the inorganic reflecting layer due to silver ionic migration.

Examples of the glass layer may include silica glass, soda-lime glass, borosilicate glass, alumino-borosilicate glass, zinc borosilicate glass, phosphate glass, and the like. These kinds of glass may be provided in a single layer or multiple layers. Alternatively, different kinds of glass may be used depending on a position where the glass layer is provided. The glass layer preferably has a thickness of about 1 to 10 µm.

(Protective Film)

As illustrated in FIG. 7, further, a protective film 4 may be provided as a covering layer on the inorganic reflecting layer and the glass layer. Examples of the material of the protective film may include oxides such as $Al_2O_3$, $SiO_2$, $TiO_2$, $ZrO_2$, $ZnO$, $Nb_2O_5$, $MgO$, $In_2O_3$, $Ta_2O_5$, $HfO_2$, $SeO$, $Y_2O_3$, and $SnO_2$; nitrides such as AlN, TiN, and ZrN; and fluorides such as $ZnF_2$ and $SrF_2$. These materials may be used alone or in combination. Alternatively, these materials may be used in a stacked manner. The protective film has a thickness whose preferable range varies to a certain degree depending on a material to be used. The thickness of the protective film is preferably about 1 nm to 300 nm, more preferably 5 nm to 100 nm. In the case where the protective film has a multilayer structure, the total thickness of the layers preferably falls within this range.

In the case where a wire is used after the light emitting element is mounted, the protective film is preferably formed after the wire is provided.

The protective film may cover at least a portion of the surface of the covering layer. The protective film preferably covers substantially the entire surface of the covering layer. Thus, the protective film further allows the wiring substrate to be less susceptible to an influence of moisture, and can effectively suppress discoloration of silver.

The protective film can be formed by ALD (Atomic Layer Deposition), sputtering, vapor deposition, and the like.

<Light Emitting Device>

Figure 6A:
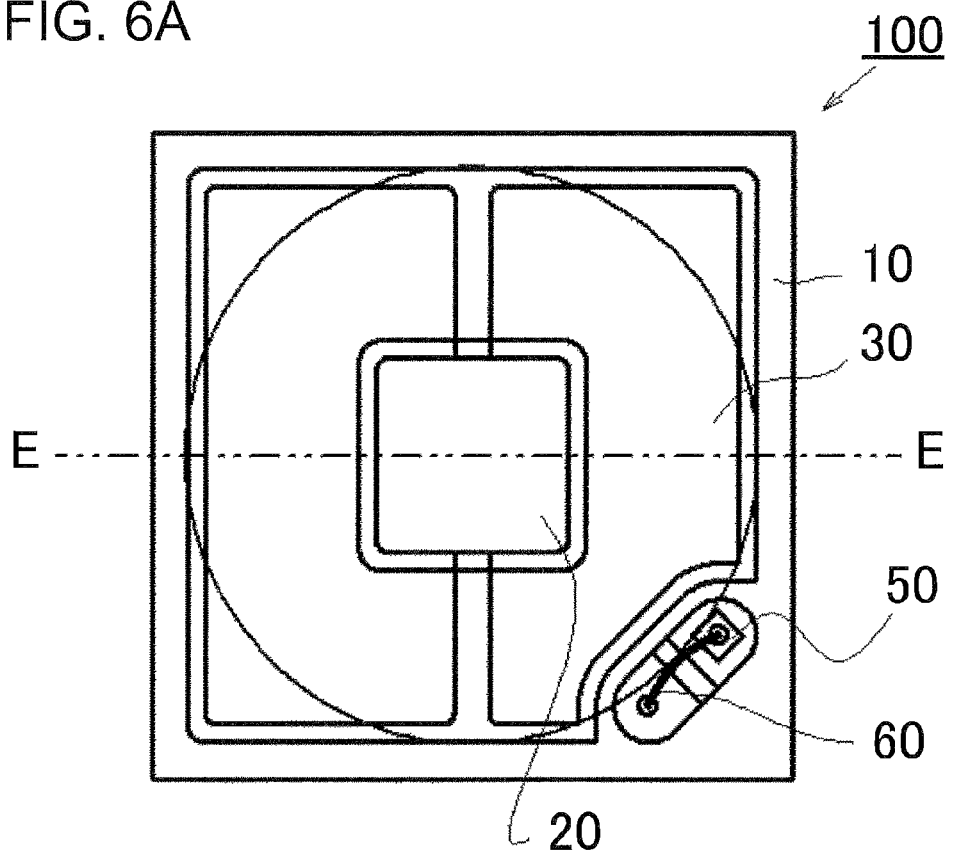
FIG. 6A is a schematic top view illustrating a light emitting device according to an embodiment.
Figure 6B:
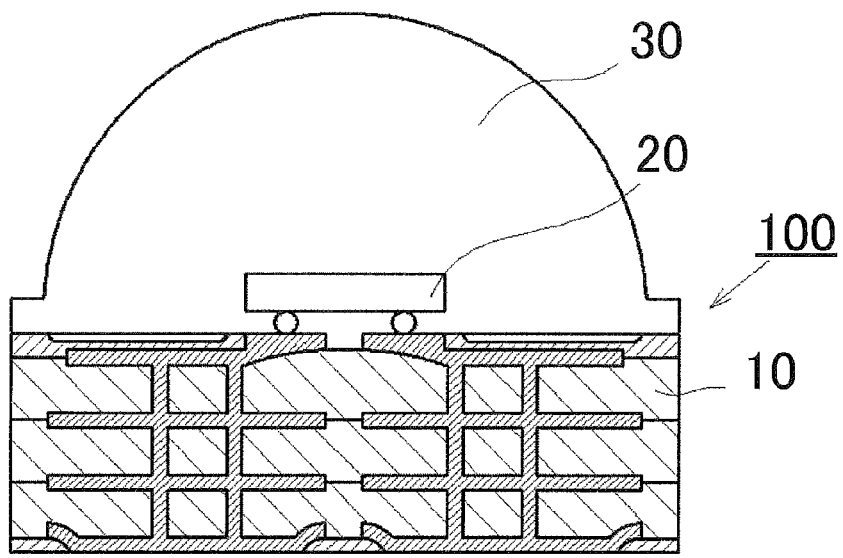
FIG. 6B is a schematic sectional view taken along line E-E in FIG. 3.

Next, with reference to FIGS. 6A and 6B, a light emitting device which uses the wiring substrate will be described. FIG. 6A is a schematic top view of the light emitting device 100, and FIG. 6B is a schematic sectional view taken along line E-E in FIG. 3A. In the embodiment, the light emitting device 100 includes one light emitting element 20 mounted in a face-down manner at substantially the center on the upper surface of the flat plate-shaped wiring substrate 10, and a light transmissive sealing member 30 is provided to cover the light emitting element 20.

(Light Emitting Element)

In the embodiments, a light emitting diode which is a semiconductor light emitting element Is preferably used as the light emitting element.

The light emitting element to emit light of a desired wavelength can be selected. For example, for a blue or green light emitting element, ZnSe, a nitride-based semiconductor ($In_XAl_YGa_{1-X-Y}N$, $0 \leq X$, $0 \leq Y$, $X+Y \leq 1$), or the like can be employed. For example, for a red light emitting element, GaAs, InP, or the like can be used. Also, a semiconductor light emitting element made of a material other than these materials can also be used. The composition, the color of emitting light, the size, and the number can be appropriately selected in accordance with the purpose.

In the case where the light emitting device includes a phosphor, the light emitting element is suitably made of a nitride semiconductor ($In_XAl_YGa_{1-X-Y}N$, $0 \leq X$, $0 \leq Y$, $X+Y \leq 1$) which allows emission of light with a short wavelength capable of efficiently exciting the phosphor. Various emission wavelengths can be selected depending on the material of a semiconductor layer, and the degree of mixed crystal of the semiconductor layer.

In addition to the light emitting elements to emit light in the visible light region, the light emitting elements to emit ultraviolet light or infrared light can also be employed. Further, a light receiving element and the like can be mounted in addition to the light emitting element.

(Sealing Member)

The sealing member is a member configured to protect the light emitting element, a protective element, and the like from dust, moisture, external force, and the like. Moreover, the sealing member preferably has light-transmissive property which allows propagation of light therethrough, and also has a property resistant to the light emitted from the light emitting element. Specific examples of the material of the sealing member may include a silicone resin, an epoxy resin, and a urea resin. In addition to these materials, the sealing member may contain a colorant, a light diffusing agent, a filler, a color converting member (a fluorescent member), and the like if desired.

The surface shape of the sealing member can be variously selected in accordance with a light distribution characteristic and the like. For example, the upper surface of the sealing member may be formed into a flat shape, a protruded shape, a recessed shape, or a combined shape of these shapes. FIG. 2B illustrates a sealing member which has a convex lens shape with its vertex located above the upper surface of the light emitting element, and has a flat flange portion formed around the convex lens portion.

The sealing member may have a single-layer structure or a multilayer structure which includes at least two layers, and a diffusing agent, a pigment, a phosphor, and the like may be mixed into any one of the layers or the entire layers in accordance with the purpose and the usage.

Examples of the phosphor may include an yttrium-aluminum-garnet (YAG)-based phosphor activated with cerium, a lutetium-aluminum-garnet (LAG) activated with cerium, a nitrogen-containing calcium aluminosilicate ($CaO$—$Al_2O_3$—$SiO_2$)-based phosphor activated with europium and/or chromium, a silicate (($Sr,Ba)_2SiO_4$)-based phosphor activated with europium, a β-SiAlON phosphor, a KSF-based phosphor ($K_2SiF_6$:Mn), a quantum dot phosphor, and the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims. The present application is based on Application No. 2013-264,949 filed in Japan on Dec. 24, 2013, the content of which is incorporated herein by reference.

What is claimed is:

1. A wiring substrate comprising:
    a ceramic layer; and
    a conductive member including a conductive layer disposed on an upper surface of the ceramic layer, wherein
    the conductive member includes silver and at least a portion of an upper surface of the conductive layer is covered with a covering layer; and
    the covering layer includes an inorganic reflecting layer and a glass layer stacked on the inorganic reflecting layer.

2. The wiring substrate according to claim 1, wherein the inorganic reflecting layer covers the ceramic layer.

3. The wiring substrate according to claim 1, wherein the glass layer is spaced apart from the conductive layer.

4. The wiring substrate according to claim 1, wherein the upper surface of the conductive layer occupies 10 to 90% of the upper surface of the ceramic layer.

5. The wiring substrate according to claim 1, wherein the conductive member contains 5 to 50 wt % inorganic oxide.

6. The wiring substrate according to claim 1, wherein the covering layer defines an opening to expose the conductive layer, and
    the conductive layer in the opening comprises a metal layer disposed on the upper surface thereof, the metal layer being made of a material different from the material of the conductive layer.

7. The wiring substrate according to claim 1, further comprising:
    a protective film disposed on the covering layer.

8. A light emitting device comprising:
    the wiring substrate according to claim 1; and
    a light emitting element mounted thereon.

* * * * *